United States Patent [19]

Kaiser

[11] 4,143,386
[45] Mar. 6, 1979

[54] JUNCTION TYPE FIELD EFFECT TRANSISTOR

[75] Inventor: Reinhold Kaiser, Heilbronn-Sontheim, Fed. Rep. of Germany

[73] Assignee: Licentia Patent-Verwaltungs-G.m.b.H., Frankfurt am Main, Fed. Rep. of Germany

[21] Appl. No.: 810,753

[22] Filed: Jun. 28, 1977

[30] Foreign Application Priority Data

Jul. 3, 1976 [DE] Fed. Rep. of Germany ....... 2630079

[51] Int. Cl.² ............................................. H01L 29/80
[52] U.S. Cl. ........................................ 357/22; 357/89; 357/90
[58] Field of Search .............................. 357/22, 89, 90

[56] References Cited

U.S. PATENT DOCUMENTS 4,053,915  10/1977  Cave ...................................... 357/22

Primary Examiner—Edward J. Wojciechowicz
Attorney, Agent, or Firm—Spencer & Kaye

[57] ABSTRACT

A junction type field effect transistor comprises a source region and a drain region extending into a semiconductor body further than the channel region and a gate region located entirely within the channel region between the source and drain regions, leaving an exposed external surface. The invention also includes a method of making such a transistor.

10 Claims, 8 Drawing Figures

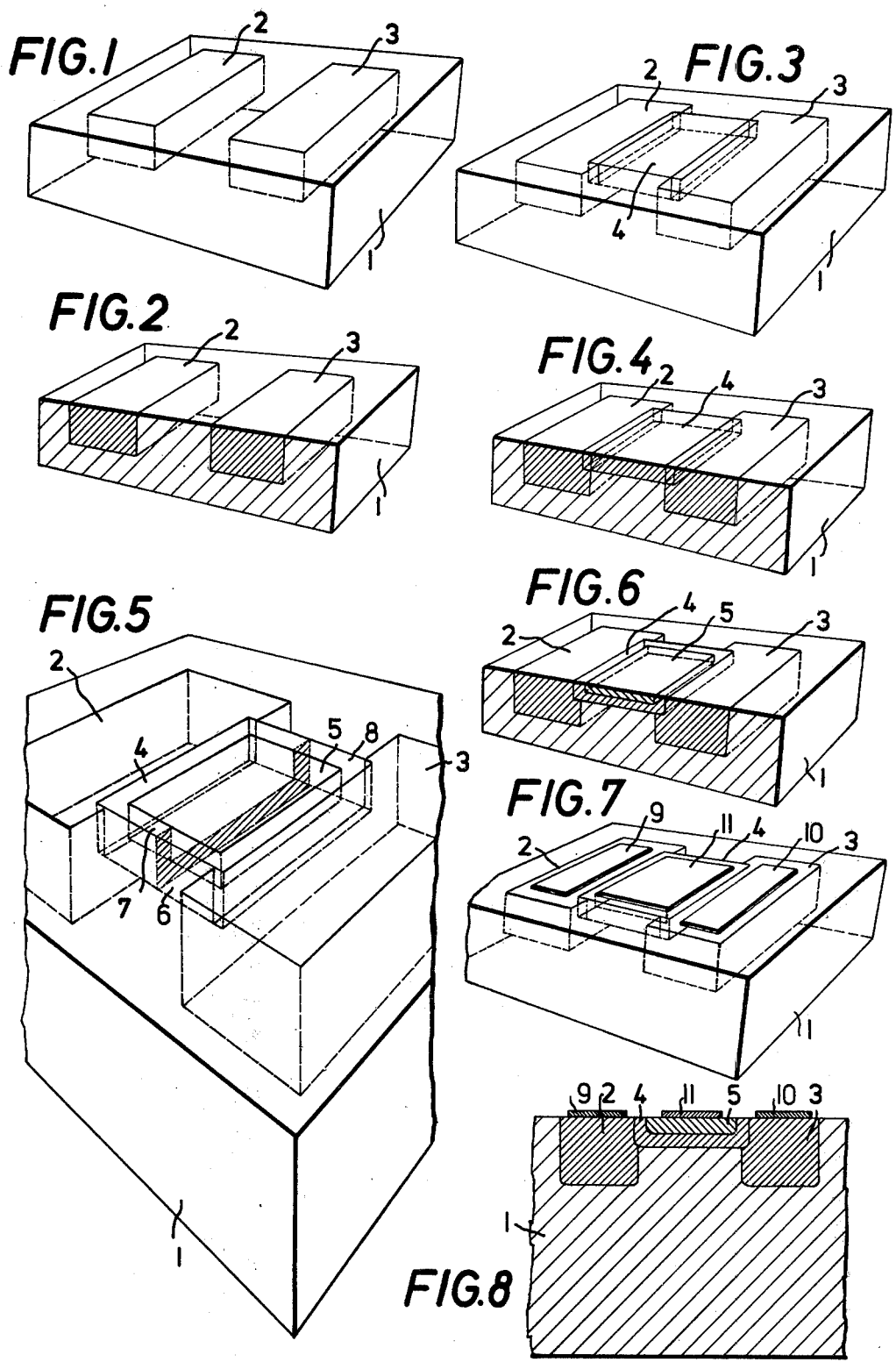

JUNCTION TYPE FIELD EFFECT TRANSISTOR

BACKGROUND OF THE INVENTION

The invention relates to a junction-type field-effect transistor having a gate region which has the opposite type of conductivity of the channel region, in which the source region and the drain region extend deeper into the semiconductor body than the channel region.

SUMMARY OF THE INVENTION

The object of the invention is to provide a junction-type field-effect transistor in which the gate region, also called the control region, is isolated from the basic material of the semiconductor body.

According to a first aspect of the invention, there is provided a junction type field-effect transistor comprising a semiconductor body, a source region in said semiconductor body, a drain region in said semiconductor body, a channel region in said semiconductor body extending a shorter distance into said semiconductor body than said source region and said drain region and a gate region of opposite conductivity type to said channel region and located entirely within said channel region between said source region and said drain region leaving an exposed external surface.

Further according to this aspect of the invention, there is provided a junction-type field-effect transistor having a gate region which has the opposite type of conductivity to the channel region, in which transistor the source and the drain extend deeper into the semiconductor body than does said channel region, characterized in that said gate region is embedded completely in said channel region in the region between said source and said drain with the exception of its surface.

According to a second aspect of the invention, there is provided, a method of manufacturing a junction-type field-effect transistor comprising introducing a source and drain region into said semiconductor body, introducing a channel region into said semiconductor body to a depth less than that of said source and drain regions, and introducing a gate region of opposite conductivity to said channel region totally into said channel region between said source and drain regions leaving a free exterior surface on the surface of said semiconductor body.

BRIEF DESCRIPTION OF THE DRAWINGS

The invention will now be described in greater detail, by way of example, with reference to the drawings, in which:

FIG. 1 is a perspective view of a first stage in the production of one form of transistor in accordance with the invention;

FIG. 2 is a view similar to FIG. 1 but is cut along a section line;

FIG. 3 is a view similar to FIG. 1 but showing the formation of the channel region;

FIG. 4 is a view similar to FIG. 3 but is cut along a section line;

FIG. 5 is a perspective view of part of the transistor showing the formation of the gate region;

FIG. 6 is a view similar to FIG. 4 but showing the formation of the gate region;

FIG. 7 is a view similar to FIG. 3 but showing the electrode formation; and

FIG. 8 is a sectional view of the transistor as shown in FIG. 7.

DESCRIPTION OF THE PREFERRED EMBODIMENTS

In a preferred embodiment of the invention, in a junction-type field-effect transistor of the type mentioned at the outset, it is proposed that the gate region should be completely embedded, with the exception of its surface in the channel region in the region between the source and drain. With a gate region having a rectangular structure the side walls of the channel region extending to the semiconductor surface border on the side walls of the gate region which extend between the source region and the drain region.

In a refinement of the invention the source region and the drain region directly border the gate region, which in another embodiment of the invention the gate region is surrounded on all sides by the channel region so that the source region and the drain region do not border the gate region but the channel region. In all cases the surface of the gate region is naturally not surrounded by the channel region.

In accordance with a further feature of the invention, those portions of the channel region which extend to the semiconductor surface between the source region and the drain region have a sheet resistance which is at most 50% smaller than that of the portion of the channel region which is parallel to the semiconductor surface and beneath the gate region. As the result of this measure, it is achieved that the channel length may be selected so as to be small and an optimum control action may be achieved. Moreover, the junction-type field-effect transistor according to the invention makes small structures possible and these may be compared to those of MOS transistor. Because of the small structures, high packing densities may be achieved.

The advantages of the invention are even better if the sheet resistance of the parts of the channel region extending between the source region and the drain region as well as up to the semiconductor surface is the same or greater than the sheet resistance of the part of the channel region extending parallel to the semiconductor body surface i.e. the portion below the gate region. The optimum is achieved if the sheet resistance of the parts of the channel region extending between the source and the drain as well as up to the semiconductor surface is as large as possible yet this sheet resistance cannot be made as large as desired since too large a sheet resistance reduces the break down voltage between the gate region and the channel and/or the substrate material. Therefore the sheet resistance should be selected not so high that the required break down voltage between the gate region and the source region or the drain region and/or between the gate region and the substrate cannot be maintained. A limit for the sheet resistance thus only represents the break down voltage. Influencing the break down voltage by means of a sheet resistance of course takes place only with corresponding thickness of the channel region (a spacing between the gate region and the substrate).

In practice, one case is of particular interest, i.e. that according to which the parts of the channel region extending between the source region and the drain region as well as to the semiconductor surface, i.e. the two side walls of the channel region, have the same impurity concentration and the same thickness as the part of the channel region running parallel to the semiconductor surface, i.e. the bottom of the channel region beneath the gate region. Fairly large sheet resistance values do in fact bring even better results yet this proposal may be most easily implemented in practice and in fact according to a further development of the invention such that both the channel region and the gate region are diffused through the same diffusion window in an insulating layer located on the semiconductor surface of the field-effect transistor. As already expressed, the refinement in accordance with the invention of the junction-type field-effect transistor may of course also be achieved in another manner, for example by means of ion implantation.

Referring now to the drawings, FIG. 1 shows a semiconductor body 1 of a first type of conductivity and two semiconductor regions 2 and 3 of the opposite type of conductivity. The semiconductor region 2 for example is used as a source and the semiconductor region 3 is used as a drain. The semiconductor regions 2 and 3 are diffused inwards into the semiconductor body 1, for example with the aid of the diffusion mask technique. The insulating layer required for this and having the diffusion windows is not shown in FIG. 1. FIG. 2 is a distinguished from FIG. 1 only in that it is a sectional view.

After manufacturing the source and the drain, in accordance with FIGS. 3 and 4, the channel region 4 is introduced into the semiconductor body 1. The channel region 4 connects the source and the drain regions 2 and 3 together and has the same type of conductivity as the source and the drain regions 2 and 3. As FIGS. 3 and 4 show, the diffusion region which produces the channel region 4 extends laterally into the source and drain regions. The channel region 4 may be manufactured, for example with the aid of planar diffusion or by means of ion implantation.

After manufacturing the channel region 4, the gate region 5 is let into the channel region in accordance with FIG. 5. As FIG. 5 shows the gate region 5 is completely embedded in the channel region 4 in the region between the source and the drain regions 2 and 3 with the exception of its surface, i.e. side walls of the channel region 4 which extend up to the semiconductor surface, border the side walls of the gate region 5 extending between the source and the drain regions 2 and 3. As a result the gate region 5 is isolated from the semiconductor body 1. The gate region 5 has the first type of conductivity and forms a pn-junction with the channel region 4. The gate region 5 is manufactured by diffusion, in the embodiment shown, as is channel region 4 and in fact the doping materials for both regions 4 and 5 are diffused through one and the same diffusion window in an insulating layer (not shown) located on the semiconductor surface.

In accordance with FIG. 5 the channel region 4 has a bottom portion or floor 6 beneath the gate region 5 as well as two side walls 7 and 8. The two side walls 7 and 8 of the channel region 4 extend from the source 2 to the drain 3. The condition that sheet resistance of the channel region 4 is as large as possible yet not so large that it restricts the break down voltage between the gate region and the channel region too greatly must be fulfilled for these side walls 7 and 8. In this embodiment, the sheet resistance of the floor 6 of the channel region 4 is the same as the sheet resistance of the side walls 7 and 8 and moreover the floor 6 has the same thickness as the side walls 7 and 8. These relationships are to be attributed, in the illustrated embodiment, to the fact that both the channel region 4 and the gate region 5 are diffused into the semiconductor body 1 through the same diffusion window. Even better ratios are archieved if the sheet resistance of the side walls 7 and 8 is greater than the sheet resistance of the floor 6.

FIG. 6 shows the junction-type field-effect transistor of FIG. 5 in a sectional view. In the arrangement of FIG. 7 the source 2 is contacted by the electrode 9, the drain 3 is contacted by the electrode 10 and the gate region 5 by the electrode 11.

In order that the wrong impression that the source 2 and the drain 3 extend up to the lower surface of the semiconductor body 1 does not arise, the junction-type field-effect transistor is shown in FIG. 8 once again in a sectional view which makes it clear that the source and drain have a considerable spacing from the lower main surface of the semiconductor body in reality. A sheet resistance as is known has the dimension of ohms per unit area.

The gate region may or may not extend laterally into the source and drain regions in the junction-type field-effect transistor in accordance with the invention. If the gate region does not extend laterally into the source and drain regions, then there is a channel region 4 with a tub shape, i.e. the channel region has four side walls and a channel floor. In this case the gate region is surrounded on all sides by the channel region with the exception of the surface and is embedded completely into the channel region. If the gate region, on the other hand, extends laterally into the source and drain regions then the channel region does not have a tub shape and only has two side walls, i.e. those which extend between the source and the drain regions. In this case the gate region is embedded into the channel region only in the region between the source and drain regions.

It will be understood that the above description of the present invention is susceptible to various modification changes and adaptations.

What is claimed is:

1. In a junction-type field-effect transistor having a semiconductor body of a first conductivity type, spaced source and drain regions of the opposite conductivity type extending into said semiconductor body from one major surface of same, a channel region of said opposite conductivity type extending into said semiconductor body from said one major surface and extending along said one major surface from said source region to said drain region, and a gate region of said first conductivity type extending into said channel region from said one major surface, said source region and said drain region extending deeper into said semiconductor body than does said channel region, the improvement wherein said gate region is embedded completely in said channel region in the portion of same between said source region and said drain region except for the portion of said gate region which extends along said major surface.

2. A field-effect transistor as defined in claim 1, wherein the portions of said channel region extending to said major surface of said semiconductor body and which extend between said source and said drain regions have a sheet resistance (ohms per unit area) which is at most 50% smaller than that of the portion of said channel region which extends parallel to said major surface of said semiconductor body and is beneath said gate region.

3. A field-effect transistor as defined in claim 1, wherein the portions of said channel region extending to said major surface of said semiconductor body and which extend between said source and said drain regions, have a sheet resistance which is the same or greater than the sheet resistance of the portions of said channel region extending parallel to said major surface of said semiconductor body and beneath said gate region.

4. A field-effect transistor as defined in claim 1, wherein the sheet resistance of the portions of said channel region extending to said major surface of said semiconductor body and which extend between said source and said drain regions have as large a sheet resistance as possible but less than that at which the desired break down voltage between said gate region and said source or drain and/or between said gate region and said substrate cannot be maintained.

5. A field-effect transistor as defined in claim 1, wherein the portions of said channel region extending to said major surface of said semiconductor body and which extend between said source and said drain regions have the same impurity concentration and the same thickness as the portion of said channel region extending parallel to said major surface of said semmiconductor body and beneath said gate region.

6. In a method of manufacturing a field-effect transistor as defined in claim 1 including forming said source, drain, channel and gate regions in said semiconductor body by introducing selected impurities into desired portions of the semiconductor body, the improvement comprising introducing the impurities for said channel region and said gate region into said semiconductor body through one and the same window in an insulating layer located on the surface of said semiconductor body.

7. A method as defined in claim 6, and comprising initially forming said source and drain regions in said semiconductor body and thereafter introducing the impurities said channel region and said gate region into said semiconductor body through one and the same window.

8. A method as defined in claim 6, and comprising forming said semiconductor regions in said semiconductor body by means of diffusion or by means of ion implantation.

9. A junction-type field-effect transistor comprising a semiconductor body of a first conductivity type, a source region of the opposite conductivity type in said semiconductor body, a drain region of the opposite conductivity type in said semiconductor body, a channel region of said opposite conductivity type in said semiconductor body, said channel region extending between said source and drain regions and a shorter distance into said semiconductor body than said source region and said drain region, and a gate region of opposite conductivity type to said channel region and located entirely within said channel region between said source region and said drain region except for an exposed external surface whereby said gate region is electrically isolated from the other portions of the semiconductor body with the same conductivity type.

10. A method of manufacturing a junction-type field-effect transistor comprising introducing spaced source and drain regions of a first conductivity type into a semiconductor body of the opposite conductivity type, introducing a channel region of said first conductivity type into said semiconductor body between said source and drain regions and to a depth less than that of said source and drain regions, and introducing a gate region of opposite conductivity type to said channel region totally into said channel region between said source and drain regions leaving a free exterior surface for said gate region on the surface of said semiconductor body.

* * * * *